United States Patent [19]
Elliott et al.

[11] Patent Number: 4,691,107
[45] Date of Patent: Sep. 1, 1987

[54] INFRA RED PHOTO DETECTOR SYSTEMS

[75] Inventors: Charles T. Elliott; Anthony M. White, both of Malvern, England

[73] Assignee: The Secretary of State for Defence, London, England

[21] Appl. No.: 784,469

[22] Filed: Oct. 4, 1985

Related U.S. Application Data

[62] Division of Ser. No. 485,888, Apr. 18, 1983, Pat. No. 4,572,953.

[30] Foreign Application Priority Data

Apr. 19, 1982 [GB] United Kingdom ................ 8211291

[51] Int. Cl.[4] .............................................. H01L 31/00
[52] U.S. Cl. .................................... 250/370; 250/334; 250/338
[58] Field of Search ....... 250/370 H, 370 G, 370 J X, 250/338 S E, 330, 332, 334, 347, 342

[56] References Cited

U.S. PATENT DOCUMENTS 3,870,887 3/1975 Dueker et al. ................... 250/211 J
4,467,201 8/1984 Blackburn et al. ................ 250/334

FOREIGN PATENT DOCUMENTS 780089 7/1957 United Kingdom .
1542679 2/1975 United Kingdom .
2099653 6/1981 United Kingdom ........... 250/370 H Primary Examiner—Carolyn E. Fields
Attorney, Agent, or Firm—Cushman, Darby & Cushman

[57] ABSTRACT

An infra red photo detector system comprises a piece of detector material, such as $Cd_xHg_{1-x}Te$, InSb, InAs, etc, carrying at least a pair of spaced electrodes. An optical arrangement directs a small spot of radiation onto the detector. The position of the small spot on the much larger detector is found by applying an electrical bias between the electrodes causing a drift of photo carriers. The bias may be of alternating polarity and the detector output measured at each polarity. Alteratively a high frequency bias may be applied and the A.C. offset from the detector used to indicate spot position. Alternatively the spot position may be modulated or swept along the detector by a mirror moving in a sawtooth scanning action.

15 Claims, 8 Drawing Figures

INFRA RED PHOTO DETECTOR SYSTEMS

This is a division of application Ser. No. 485,888 filed Apr. 18, 1983, now U.S. Pat. No. 4,572,953.

This invention relates to infra red (I.R.) photo detector systems, using detectors that change their resistivity when illuminated by infra red radiation.

Photo detectors are used in a variety of infra red detection systems. For example burglar alarms where the body heat, of a person passing through a door, is focussed onto an infra red detector. The change in resistivity of the detector causes an alarm signal. Such a system senses only the near presence of a person or other hot object such as a fire. More elaborate systems may use an array of detectors to give an approximate position or direction of a hot object in accordance with the particular detector illuminated. Such systems are often termed staring arrays. The positional accuracy for determining hot objects is limited by the number and size of detectors. Using very large numbers of small detectors a reasonable image of a thermal scene is theoretically obtainable. However each detector is only capable of providing a signal representing average radiation received. It cannot distinguish between overall illumination and point illumination. Resolution is thus limited by detector size.

Highly detailed information of a thermal scene is obtainable using scanned imaging systems. In these an image of an infra red scene is scanned point by point onto one or more infra red detectors. The scanning is often by rotating polygons and oscillating mirrors, and the detectors cooled by liquid nitrogen.

The detector output may be viewed via a television monitor and is observed in detail similar to that from conventional television cameras. These systems give sufficient detail for example to detect human tumours by the temperature difference between healthy and tumerous tissues. The high performance is unnecessarily good for some applications, also the cost and mechanical complexity is high.

The present invention provides greater information than is obtainable from known staring systems without the complexity of mechanical scanning systems.

According to this invention an infra red photo detector system comprises a photo detector formed by a piece of detector material between at least two spaced electrodes, means for applying an electric field to the detector, an optical arrangement for causing infra red radiation to be incident on the detector, means for measuring an electrical signal developed between the electrodes while a small area of detector material is illuminated with a spot of infra red radiation, whereby the position of the incident spot relative to the electrodes may be determined.

The detector material may be the ternary alloy $Cd_xHg_{1-x}Te$ and is preferably cooled e.g. by liquid nitrogen. Alternatively the detector material may be InSb, InAs, etc.

The detector may be incorporated into a bridge circuit.

The optical arrangement may incorporate a mirror which is oscillated to sweep the spot in a circle on the detector.

The spot position may be determined for example by applying an alternating bias to the electrodes; by scanning the spot along the detector; applying a small modulation of spot position on the detector; or a high frequency bias to the electrodes.

The system may use a single detector or a multiplicity of detectors forming an array.

The invention will now be described, by way of example only, with reference to the accompanying drawings of which:

Figure 1:
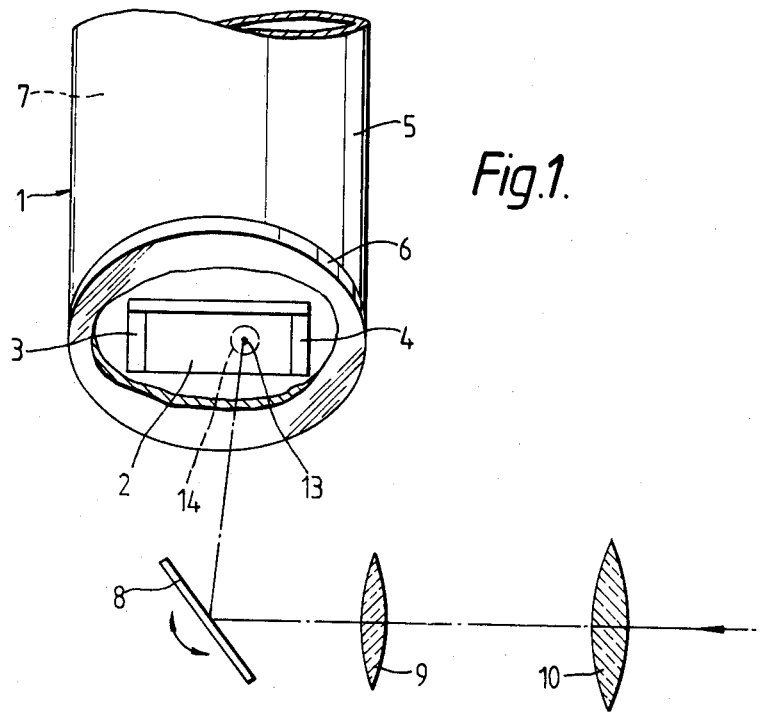
FIG. 1 is a view of an infra red detector system that can operate in a staring or a swept mode.

As seen in FIG. 1 a detector system 1 comprises a piece of infra red detector material 2 such as the ternary alloy $Cd_xHg_{1-x}Te$. Typical dimensions are 100 μm square. Strip electrodes 3, 4 are attached along two opposite edges of the detector material 2. The detector 2, 3, 4 is mounted inside an evacuated envelope 5 above an infra red transparent window 6 e.g. of germanium and cooled by liquid nitrogen 7.

A mirror 8 and lenses 9, 10 direct infra red radiation onto the detector material 2. The mirror 8 may be fixed, or oscillated as described later.

Figure 2:
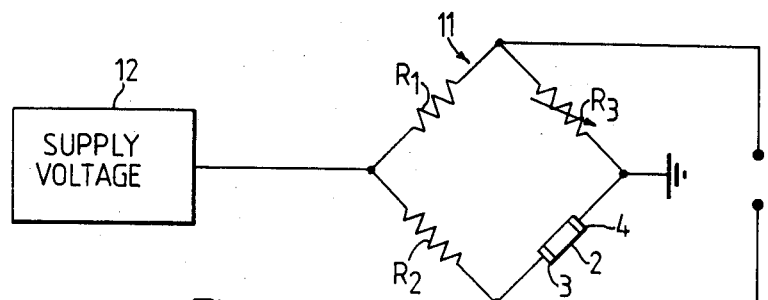
FIG. 2 is a circuit diagram showing the detector of FIG. 1 connected in a bridge network.

The detector of FIG. 1 is connected in a bridge network 11 as shown in FIG. 2. This bridge 11 comprises two fixed resistors $R_1$, $R_2$, and a variable resistor $R_3$ for balancing. Input to the bridge 11, either D.C. or A.C. is from a voltage supply 12.

Figure 3:
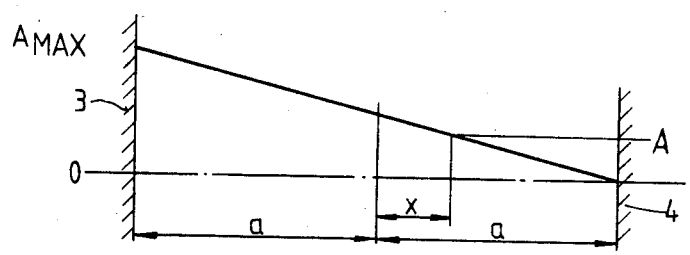
FIGS. 3, 4 are graphs showing the output of the bridge for positive and negative bias applied to the detector of FIG. 1 as a function of the position of a small spot of illumination.

When a spot area 13 of the detector 2 is illuminated with infra red radiation photo carriers are generated. Let the detector length between electrodes 3, 4, be $2a$ and the position of the illuminated spot measured from the centre be x, FIGS. 3, 4. For n-type material with a carrier concentration of about $5 \times 10^{14}$ cm$^{-3}$ applying a positive voltage to electrode 3 causes a photo carrier drift to the right. When the applied field is sufficiently high e.g. 30 volts/cm the minority carriers are swept towards the earth contact 4, whre they recombine. For steady state conditions the change of resistance between electrodes 3, 4 is proportional to the distance photo carriers drift before recombining. The part of detector material carrying the drifting carriers is of reduced resistance compared to the remainder of the detector material. FIG. 3 shows the resistance change between electrodes 3, 4 for varying values of x, the position of constant spot 13 illumination. At the right hand edge carriers recombine into electrode 4 as they are formed, i.e. zero drift path length, and so the resistance change developed is zero. At the left hand edge the carriers drift the hole length of detector, i.e. drift path length is $2a$, and the resistance change between electrodes 3, 4 is at a maximum value of $A_{MAX}$.

Figure 4:
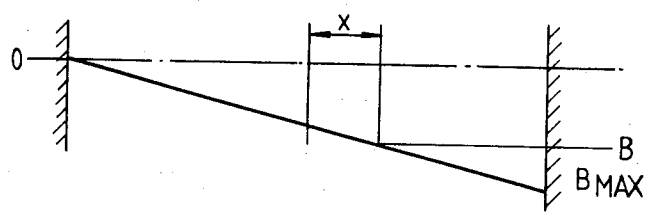

Similarly when a negative potential is applied to electrode 3 the carriers drift to the left FIG. 4. The minimum resistance change, developed occurs when the illuminating spot 13 is by the left hand electrode 3, and the maximum resistance change $B_{MAX}$ occurs when the spot 13 is near the right hand electrode 4.

The position, x, along the detector 2 of illuminating spot 13 is determined by measuring A, B, as follows:

$A = k(a-x)$, k is proportional to the illumination intensity $-=k(-a-x)$ $x = \dfrac{a(B-A)}{B+A}$.

A and B are regarded as positive quantities.

For example if the change in the negative direction, equals the change in the positive direction (B=A) then x=0, the centre.

Thus by applying first a positive potential and then a negative potential to electrode 3 the position of the illuminating spot 13 is obtained. For example the position of a 5 μm diameter spot along a 50 μm length is obtained.

The responses shown in FIG. 3, 4 are idealized. In practice the curves are not quite linear in the region and may differ considerably near the contacts 3, 4. Corrections for these variations may be allowed for using a look up table e.g. using a programmed read only memory (R.O.M.)

The bridge of FIG. 2 may be adjusted to give zero output for zero point illumination, or zero uniform illumination. When balanced for zero illumination, uniform illumination over the complete detector from background radiation will give A=B corresponding to an apparent x=0. When balanced for uniform background illumination A=B=0. Deviation of background will cause a spurious signal corresponding to an apparent target at x=0 because the equations for x above do not apply to uniform illumination. Thus continuous monitoring of background is desirable and the bridge balanced accordingly.

Figure 5:
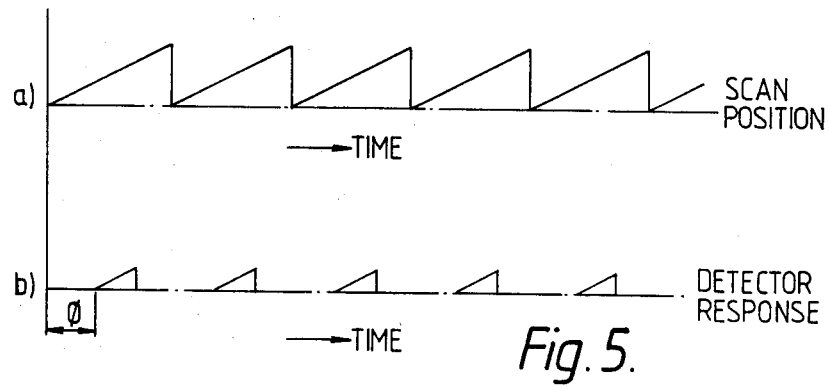
FIG. 5 is a graph showing the bridge output when a spot of infra red radiation is scanned repetitively along the detector.

The effect of background illumination and bias pedestal can be removed by scanning the spot 13 along the detector 2 with the mirror 8. FIGS. 5a shows a graph of mirror 8 position which is caused by scan in a saw-toothed manner. As the mirror scans it sweeps a spot 13 of infra red radiation along the detector 2 in a direction opposite to photo carrier drift. This results in a ramp response on the bridge output as shown in FIG. 5b. The position of this ramp signal within each scan represents the angular position of the target forming the spot 13 relative to the scan extreme positions. The length of the ramp signal is a function of detector length and system optics. Target angular position is thus determined by a timing circuit which times the interval Φ between a synchronization pulse at the beginning of each scan and receipt of the ramp signal (leading or trailing edge).

The above arrangement can be extended to determine the angular position of a plurality of infra red sources. Each source will be detected as a ramp voltage by the bridge.

In an alternative arrangement the mirror 8 is caused to precess or wobble so that a spot 13 moves in a small circle on the detector 2. This gives a bridge output signal $dA = kdx$.

The main signal intensity is $A = k(a-x)$ from which x is extracted. The modulation dA is insensitive to background or bias pedestal.

In both the scanning and wobbling system the mirror movement is slow in comparison with carrier drift velocity. For example carrier lifetime may be 1 to 10 μs, drift velocity $5 \times 10^3$ to $5 \times 10^4$ cm/sec depending on bias pedestal 2 to 20 ma, scan velocity 1/10×drift velocity, modulation velocity 1/10 drift velocity.

Another form of the invention uses a high frequency bias applied by the voltage sources 12. This is arranged such that frequency $f \geq \mu E/2a$ μ is typically 300 cm$^2$/voltsec.

E is peak field 2a is distance between contacts 3, 4.

With such a high frequency bias carriers are not swept out within each half cycle but are swept alternately towards contacts 3, 4 on alternate half cycles and reach the contacts 3, 4 by diffusion.

For a spot 13 in the center of the detector 2 carriers reach both contacts 3, 4 equally by diffusion. When the spot 13 is displaced away from the centre then carriers are preferentially lost at the nearest contact. This leads to an asymmetry in the output (A.C.) signal at the electrodes 3, 4. The amount and direction of A.C. offset indicates spot position x on the detector 2, and the A.C. value indicates spot 13 intensity.

Alternatively the A.C. offset may be adjusted to zero by applying a D.C. bias feedback to the voltage supply 12. This optimizes sensitivity by maximizing carrier life time over complete cycles. The spot position is related to the amount of D.C. bias applied.

The above systems provide only positional information x. To provide both azimuth and elevation position the detector may be provided with a plurality of opposed electrode pairs as shown in FIGS. 6, 7.

Figure 6:
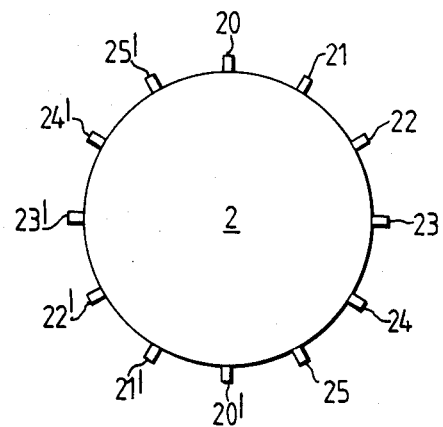
FIGS. 6, 7 are views of detectors having a plurality of electrodes so that azimuth and elevation positional information is obtainable.
Figure 7:
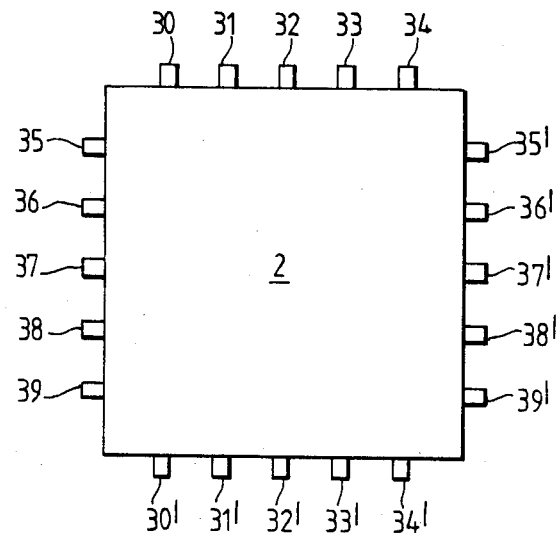

In FIG. 6 a detector 2 is arranged as a disc with discrete pairs of opposing electrodes 20, 20' to 25, 25'. Similarly a square shaped detector 2 has discrete opposing electrodes 30, 30' to 34, 34' and 35, 35' to 39, 39'.

Each opposing electrode e.g. 20, 20' is connected in sequence into a bridge 11 while the remaining contacts remain disconnected, at a floating potential. Treating the information from each pair of contacts as previously described indicates both r, and θ information in FIG. 6. To obtain x, information in FIG. 7 bias is applied between electrodes 30–34 and 30'–34' and measurements proceed as in FIG. 1, electrodes 35–39 and 35'–39' remain unconnected.

Similarly to obtain y information bias is applied between electrodes 35–39 and electrodes 35'–39' while electrodes 30–34 and 30'–34' are unconnected.

Figure 8:
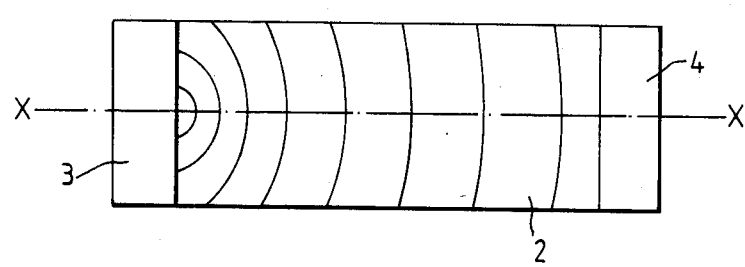
FIG. 8 is a plan view of a detector showing contours of constant sensitivity for a field applied between opposing parallel electrodes.

Another method of determining x, y uses the arrangement of FIG. 1. The effect of applying bias to electrodes 3, 4 is to produce in the detector 2 variations in sensitivity as shown in FIG. 8 which indicates contours of constant sensitivity. As shown these increase towards electrode 3 but reverse with reverse applied bias. The contours are symmetric about a lengthwise axis X X.

The mirror 6 is caused to wobble thus sweeping a spot 13 of radiation in a circle 14. The effect of sweeping the spot 13 in a circle is to cause a periodic fluctuation in the detector response as measured at the electrodes 3, 4. For a spot along the line XX the maximum response occurs when the spot is nearest electrode 3. This position may be taken as a zero phase position of the mirror 8. For spot 13 incident on the detector 2 above or below the line XX the maximum detector response occurs where the circles 14 tangent is parallel to a contour line and nearest to electrode 3. This maximum response occurs at some mirror phase angle $\pm\phi$. The measurement of x and $\phi$ uniquely indicates the position of a circle 14 (spot 13) on the detector 2. Thus information on x and $\phi$ may be fed into a look-up table formed in a random access read only memory RAROM. The resultant output is thus the x, y position of a spot 13 on the detector 2.

I claim:

1. A method of detecting the position of an infrared light source in a scene, the method including the steps of:

imaging the scene on to a photosensitive surface region of an infrared sensitive photoconductive element, the element having bias electrodes arranged to define at least one bias current path substantially parallel to the said photosensitive surface region;

applying a DC electrical bias signal to the bias electrodes to generate an output signal from the photoconductive element;

controlling the element output signal by reversing the bias polarity;

detecting the controlled element output signal; and extracting the light source image position from a difference/sum ratio of element resistance for the two bias polarities.

2. A method according to claim 1 further comprising the step of cooling the photoconductive element.

3. A method according to claim 1 further comprising the step of forming the photoconductive element from material selected from the group comprising $Cd_xHg_{1-x}Te$, InSb and InAs.

4. A method of detecting the position of an infrared light source in a scene, the method including the steps of:

imaging the scene on to a photosensitive surface region of an infrared sensitive photoconductive element, the element having bias electrodes arranged to define at least one bias current path substantially parallel to the said photosensitive surface region;

applying an electrical bias signal to the bias electrodes to generate an output signal from the photoconductive element;

controlling the bias signal polarity by reversal at a high frequency;

detecting the controlled element output signal; and extracting the light source image position by detecting the light source image position from asymmetry in the element output signal arising from resistance directionality.

5. A method according to claim 4 wherein the light source image position is detected from an offset asymmetry in the element output signal, the offset being detected in magnitude and direction.

6. A method according to claim 5 wherein the offset is processed to provide an offset counteracting DC bias feedback signal, the feedback signal being detected to indicate light source image position.

7. A method according to claim 4 further comprising the step of cooling the photoconductive element.

8. A method according to claim 4 further comprising the step of forming the photoconductive element from material selected from the group comprising $Cd_xHg_{1-x}Te$, InSb and InAs.

9. A method of detecting the position of an infrared light source in a scene, the method including the steps of:

imaging the scene on to a photosensitive surface region of an infrared sensitive photoconductive element, the element having bias electrodes arranged to define at least one bias current path substantially parallel to the said photosensitive surface region;

applying a DC electrical bias signal to the bias electrodes to generate an output signal from the photoconductive element;

controlling the element output signal by scanning the light source image in a direction opposite to carrier flow;

detecting the controlled element output signal; and extracting the light source image position by timing the element output signal relative to the image scan.

10. A method according to claim 9 wherein the image is scanned in a saw tooth manner.

11. A method according to claim 9 further comprising the step of cooling the photoconductive element.

12. A method according to claim 9 further comprising the step of forming the photoconductive element from material selected from the group comprising $Cd_xHg_{1-x}Te$, InSb and InAs.

13. A method of detecting the position of an infrared light source in a scene, the method including the steps of:

imaging the scene on to a photosensitive surface region of an infrared sensitive photoconductive element, the element having bias electrodes arranged to define at least one bias current path substantially parallel to the said photosensitive surface region and the element being arranged as one arm of a bridge circuit having a variable resistor as a second arm, the bridge being balanced by adjusting the variable resistor;

applying an electical bias signal to the bias electrodes to generate an output signal from the photoconductive element;

controlling the element output signal by reversing the bias polarity;

detecting the controlled element output signal; and extracting the light source image position from a difference/sum ratio of element resistance for the two bias polarities.

14. A method according to claim 13 further comprising the step of cooling the photoconductive element.

15. A method according to claim 13 further comprising the step of forming the photoconductive element from material selected from the group comprising $Cd_xHg_{1-x}Te$, InSb and InAs.

* * * * *